United States Patent [19]

Heppe

[11] Patent Number: 4,654,854

[45] Date of Patent: Mar. 31, 1987

[54] METHOD AND APPARATUS FOR DECODING THRESHOLD-DECODABLE FORWARD-ERROR CORRECTING CODES

[75] Inventor: Stephen B. Heppe, McLean, Va.

[73] Assignee: Stanford Telecommunications, Inc., Santa Clara, Calif.

[21] Appl. No.: 793,730

[22] Filed: Nov. 1, 1985

Related U.S. Application Data

[63] Continuation of Ser. No. 426,421, Sep. 29, 1982, abandoned.

[51] Int. Cl.⁴ .............................................. G06F 11/10
[52] U.S. Cl. .......................................... 371/43; 371/37
[58] Field of Search ................. 371/43, 45, 44, 40, 371/37, 39

[56] References Cited

U.S. PATENT DOCUMENTS

| | | | |
|---|---|---|---|
| 4,110,735 | 8/1978 | Mavemchuk | 371/43 |
| 4,130,818 | 12/1978 | Synder | 371/43 |
| 4,293,951 | 10/1981 | Rhodes | 371/43 |
| 4,295,218 | 10/1981 | Tanner | 371/45 |
| 4,322,848 | 3/1982 | Synder | 371/43 |
| 4,328,582 | 5/1982 | Battail | 371/43 |
| 4,404,674 | 9/1983 | Rhodes | 371/43 |
| 4,493,082 | 1/1985 | Cumberton | 371/43 |
| 4,519,080 | 5/1985 | Synder | 371/43 |

OTHER PUBLICATIONS

Kuo, F. F., "Computer Applications in Electrical Engineering Series", Prentice-Hall, Englewood Cliffs, N.J., 1970, p. 147.

Primary Examiner—Michael R. Fleming
Attorney, Agent, or Firm—Jim Zegeer

[57] ABSTRACT

Decoding performance of threshold-decodable forward-error-correcting codes is improved through the use of three methods. These methods employ measurements of received-digit reliability, and extended examination of syndrome digits. The first disclosed method allows correction of most partially-masked channel errors. These errors are not corrected in the prior art. The second and third disclosed methods correct almost all channel correctable with prior art, but furthermore disable action by the decoder in most cases where prior art would erroneously alter an information digit that had been received correctly.

12 Claims, 5 Drawing Figures

METHOD AND APPARATUS FOR DECODING THRESHOLD-DECODABLE FORWARD-ERROR CORRECTING CODES

This application is a continuation of application Ser. No. 426,421, filed Sept. 29, 1982, now abandoned.

FIELD OF THE INVENTION

This invention relates to an improved method and apparatus for decoding threshold-decodable forward-error-correcting codes.

DESCRIPTION OF RELATED ART INCLUDING

Information disclosed under 37 CFR Sections 1.97–1.99.

In the design of any digital communication system, one constraint is to maintain the integrity of transmitted information within acceptable limits. Information integrity is degraded by noise and other channel impairments, which cause channel errors. A typical measure of information integrity is bit-error-rate (BER). When the information BER is high, the information contains many errors at the receiving side of a communication system and the information integrity is low.

Many methods have been proposed and implemented to maintain acceptable information integrity. Forward-error-correcting (FEC) codes are one such method, and threshold-decodable codes are a subclass of FEC codes.

Forward-error-correcting codes operate by generating redundant check digits, also called parity digits, in a device called an "encoder". The parity digits are transmitted to the receiving site either multiplexed with the information or on another channel. When received, the detected information and parity digits will be found to contain errors due to noise and other impairments. If the frequency and pattern of channel errors is not too severe, the redundant data added by the encoder can be used to identify and correct the improperly-received digits. This correction procedure is implemented in a device called a "decoder", which outputs an estimate of the original information stream without redundant check digits. If the frequency and pattern of channel errors is too serve, the decoder's estimate of the original information stream will be incorrect. A "decoder error event" occurs when the decoder's estimate of an information symbol differs from the symbol actually transmitted. Decoder error events may be classified as being of Type 1 or Type 2 according to the definitions given above. These errors are not to be confused with the underlying channel errors.

Threshold-decodable codes, a subclass of FEC codes, were pioneered by Massey (U.S. Pat. Nos. 3,303,333; 3,402,393; 3,566,352). With a threshold-decodable FEC code, the decoder forms a stream of error indicators called subsolution signals or syndromes. These syndromes are based on the received information and redundant check digits. Each syndrome checks several information digits, and each information digit is checked by several syndromes.

With error-free transmission from transmitter to receiver, all syndromes will be identically zero. When errors occur, certain syndromes will be set HIGH (=1).

The decoder forms a set of subsolution signals $\{S_k\}_{xi(j)}$ for each information digit $x_i(j)$ to be decoded. These syndromes are said to be "orthogonal" on the information digit being decoded, in the sense that each syndrome of the said set checks the said information digit, but no other information digit is checked by more than one syndrome of the said set. Thus, an error on some other information digit can affect at most one of the syndromes contained in said set.

The values of all syndromes contained in $\{S_k\}_{xi(j)}$ are summed (possibly with unequal weightings, although a simple arithmetic sum is generally preferred), and the resultant sum is called the decision statistic $D_s$. $D_s$ is compared to a decision threshold $T_1$. If the threshold is equalled or exceeded, an error is declared and said information digit is corrected.[1] When the decision statistic $D_s$ is less than decision threshold $T_1$, said information digit is declared to be correct and it is passed out of the decoder as initially received.

[1] With binary data, this correction is a simple inversion. When non-binary data is employed, further processing is necessary.

This prior-art decoding technique, relying solely on the orthogonal set of subsolution signals, may be described as "algebraic decoding", since it relies only on the algebraic properties of the code.

Improvements and extensions to Massey's original work were added by Kohlenberg (U.S. Pat. No. 3,447,132), Tong (U.S. Pat. Nos. 3,593,282; 2,718,905), Cain (U.S. Pat. No. 3,662,338) and En (U.S. Pat. No. 4,193,062). In particular, Kohlenberg extended the Massey system to include a capability for burst-error correction. Kohlenberg also proposed a decoder structure incorporating information on channel reliability, to disable certain syndromes from affecting the decision statistic $D_s$ (typically, those syndromes likely to be affected by a burst of errors). Cain has elaborated the so-called guard means developed by Kohlenberg, whereby syndrome signals are disabled from affecting the decision statistic under certain conditions.

The invention disclosed herein differs from the work of Kohlenberg and Cain in its use of reliability information. Kohlenberg and Cain reduce the quantity of syndrome data entering certain decoder decisions, based on reliability information. The invention disclosed herein uses all relevant syndrome data in all decisions, and incorporates reliability information as additional data. Decoder performance is improved by increasing the quantity of information entering each decoder decision, rather than decreasing said quantity.

Tong refined the work of Massey and Kohlenberg, and proposed another use for reliability information in the decoder (U.S. Pat. No. 3,588,819). With Tong's formulation, reliability information is used to identify the probable location of channel errors. Once these locations are known, the entire power of the FEC code is applied to correcting the information digits in these locations. A so-called "hard" error, where an error has occurred but the measured reliability appears high, would not be corrected by this scheme. The invention disclosed herein allows correction of information digits with high measured reliability, and therefore differs from the work of Tong.

En, in U.S. Pat. No. 4,193,062, discloses a rate=$\frac{1}{2}$, triple-error-correcting code.

SUMMARY OF THE INVENTION

This invention embodies improved methods for decoding threshold-decodable forward-error-correcting (FEC) codes.

It is shown in this disclosure that decoder error events (errors in the decoded information stream generated by the decoder) are of two types: (1) Type 1 error. An information digit is received and demodulated incorrectly, but the decoder fails to correct it. (2) Type 2 error. An information digit is received and demodulated correctly, but the decoder inverts it (thereby inserting an error).

This invention embodies three methods for reducing the incidence of Type 1 and Type 2 errors:

1. Method 1 reduces the incidence of Type 1 errors. When a threshold decoder's decision sttatistic approaches the algebraic correction threshold, but fails to cross it, there is a chance that a Type 1 error is incipient. (i.e. the information digit was truly in error, but other errors on the channel degraded the decision statistic to a point below the threshold). Under this condition, a limited search is initiated for an information digit with low reliability. If such an information digit is found, it is corrected. With some codes, reliability information on the received parity digits is used as an additional signal to enable or disable this search.

2. Method 2 reduces the incidence of Type 2 errors. Occasionally the decoder's decision statistic will exceed the correction threshold even when the information digit being decoded is correct. This typically occurs while many error indications (syndromes) are passing through the decoder's decision circuit, which leads to ambiguity. Method 2 operates by examining an extended stream of syndrome digits for correlated error indications. This method also examines the reliability of the information digit subject to correction. If the syndrome pattern indicates an error pattern beyond the error correcting capability of the code, and the reliability of the information digit is high, the correction signal generated by the decoder is disabled.

3. Method 3 reduces the incidence of Type 2 errors, and may be substituted for Method 2 with the use of certain codes. This method controls decoder activity based only on the decision statistic and the measured information bit reliability. Examination of correlated syndromes, as in Method 2, is not implemented.

When the decoder's correction decision appears unambiguous (i.e., the correction threshold is met or exceeded, and the syndrome pattern indicates a correctable error pattern), the improved decoder emulates prior art.

A principle object of this invention is to increase the accuracy of threshold-decodable FEC codes.

Another object of this invention is to achieve the desired improvement without significant increase in decoder complexity—thereby preserving the threshold decoder's primary advantage of simplicity.

BRIEF DESCRIPTION OF THE DRAWINGS

The above and other objects, advantages and features of the invention will become clear when considered with the following specification and accompanying drawings wherein.

DESCRIPTION OF THE PREFERRED EMBODIMENTS

Figure 1:
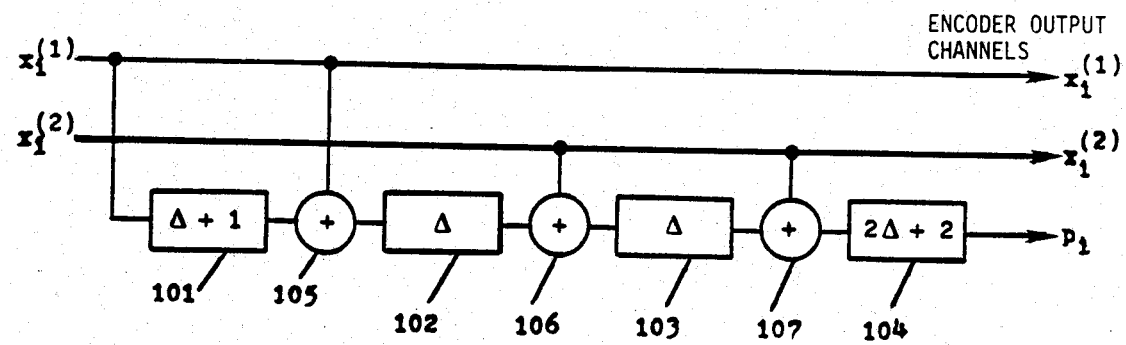
FIG. 1 is a block diagram for an encoder known in the prior art, for producing a forward-error-correcting, threshold-decodable code.
Figure 2:
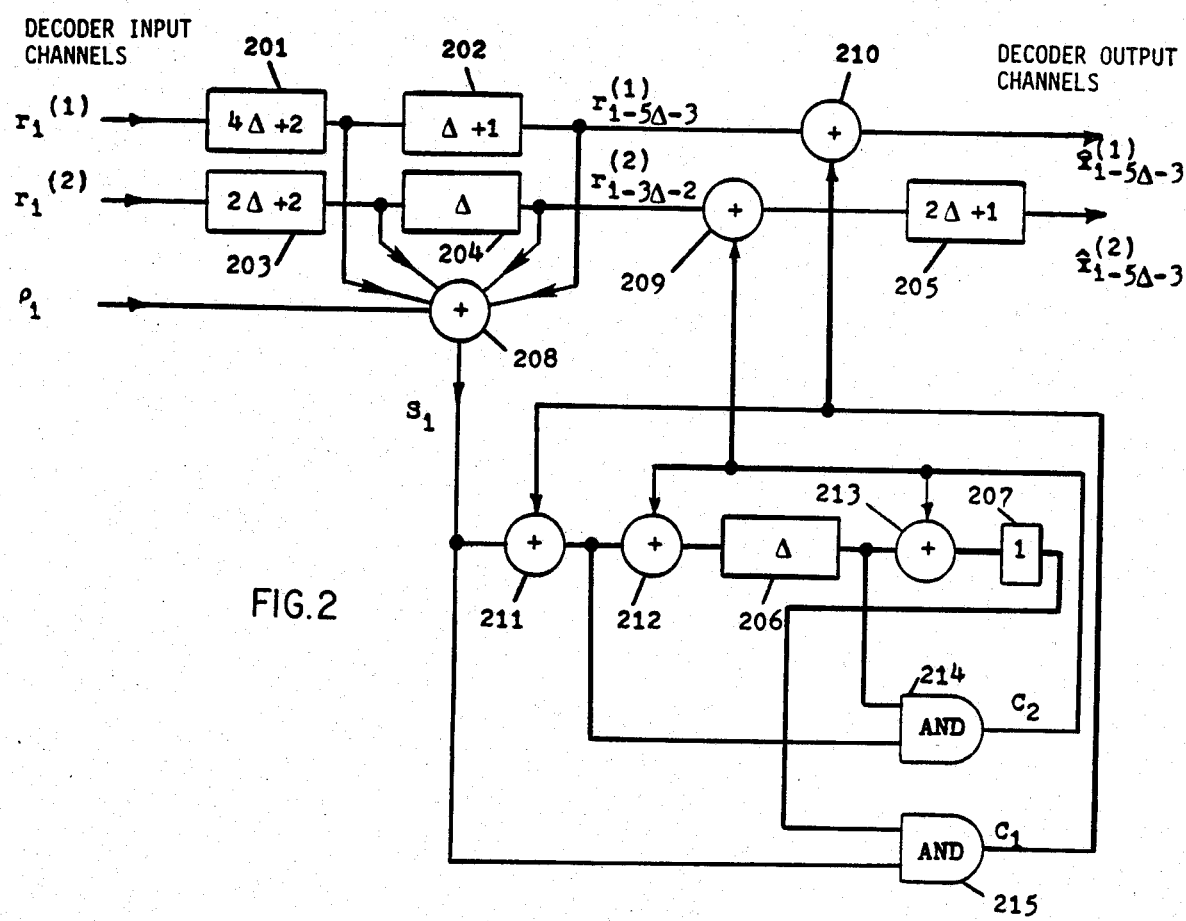
FIG. 2 is a block diagram for a decoder known in the prior art, for decoding the code produced by the encoder of FIG. 1.

As an example of threshold decoding that will prove useful below, FIG. 1 and FIG. 2 illustrate the encoder and decoder for a rate=⅔ single-error-correcting threshold-decodable FEC coding system known in the prior art. This system conforms to the work of Massey and Kohlenberg. A binary communication channel is assumed. The system will correct any isolated burst of errors less than or equal to 3Δ channel bits in length. In addition, it will correct isolated random errors.

Following the practice of previous investigators, notation is adopted wherein subscripts indicate time intervals and superscripts indicate information streams into the encoder or out of the decoder.

The encoder forms parity bits by the modulo-2 addition of selected information bits:

$$p_i = x_{i-5\Delta-3}^{(1)} \oplus x_{i-4\Delta-2}^{(1)} \oplus x_{i-3\Delta-2}^{(2)} \oplus x_{i-2\Delta-2}^{(2)} \quad \text{(Eq. 1)}$$

This is achieved through the combination of delay means 101, 102, 103, and 104, and modulo-2 adders 105, 106, and 107. The original information plus parity is transmitted over one or more imperfect channels, detected by a receiver, and passed to the decoder (FIG. 2). The decoder attempts to correct errors in received streams $r_i^{(j)}$, thereby improving the estimate, $\hat{x}_i^{(j)}$, of the originally encoded data $x_i^{(j)}$.

Errors are represented in the notation as:
$e_i^{(j)} = 1$ if an only if $r_i^{(j)} \neq x_i^{(j)}$
$\epsilon_i = 1$ if and only if $\rho_i \neq p_i$
Thus, $$r_i^{(j)} = x_i^{(j)} \oplus e_i^{(j)} \quad \text{(Eq. 2)}$$

$$\rho_i = p_i \oplus \epsilon_i$$

The decoder forms a syndrome $S_i$ composed of error components:

$$S_i = e_{i-5\Delta-3}^{(1)} \oplus e_{i-4\Delta-2}^{(1)} \oplus e_{i-3\Delta-2}^{(2)} \oplus e_{i-2\Delta-2}^{(2)} \oplus \epsilon_i \quad \text{(Eq. 3)}$$

These syndromes propogate through the syndrome register composed of delay elements 206, 207, and feedback correction elements 211, 212, 213. Selected syndromes are processed by AND gates 214, 215, to form correction signals $C_1$ and $C_2$.

$$C_1 = S_i \wedge S'_{i-\Delta-1} \quad \text{(Eq. 4)}$$

$$C_2 = S_i \wedge S'_{i-\Delta}$$

Where $\wedge$ represents a logical AND. The primed syndromes indicate potential prior feedback corrections. The effective decision threshold in this case is $T_1 = 2$.

The syndromes composing $C_1$ are orthogonal on $x_{i-5\Delta-3}^{(1)}$, in the sense that $e_{i-5\Delta-3}^{(1)}$ is the only common error component in $S_i$ and $S'_{i-\Delta-1}$. When $e_{i-5\Delta-3}^{(1)} = 1$ (i.e., $r_{i-5\Delta-3}^{(1)}$ is in error), but no other error component of $S_i$ or $S_{i-\Delta-1}'$ has value equal to 1, both inputs to AND gate 215 have value=1. This drives $C_1$ high, causing $r_{i-5\Delta-3}^{(1)}$ to be inverted and corrected. $S_i$ is also inverted, removing the error indication. When a single error component exists in $S_i$ and $S_{i-5\Delta-3}'$, but the error is not on $r_{i-5\Delta-3}^{(1)}$, only one of the syndromes will have value=1. The operation AND gate 215 thereby sets $C_i=0$, and $r_{i-5\Delta-3}^{(1)}$ will be accepted as being correct.

Similar arguments apply to $C_2$ and $r_{i-3\Delta-2}^{(2)}$.

When more than one error affects the syndromes forming $C_k$, $k=1,2$, the decoder may still respond correctly. If both errors occur on bits within the same syndrome, and neither error is on the information bit subject to correction signal $C_k$, then the syndrome remains zero, and no bit inversion takes place. This is the desired effect, since the information bit was received correctly.

On the other hand, the decoder will sometimes respond incorrectly in the presence of two or more channel errors when those errors affect the syndromes forming $C_k$.

Using the symbolism of statistical theory, consider the decoder to form the null hypothesis $H_0$: the bit subject to correction was received incorrectly. Then, with two channel errors embedded in the syndromes forming $C_k$, Type 1 and Type 2 errors occur as follows:

Type 1 Error ($H_0$ is rejected when it is true).

The information bit was received incorrectly, but the decoder fails to invert it. A secondary error "cancels out" an error indication in one of the syndromes (only one syndrome is affected due to orthogonality). Since only one syndrome remains with value=1, $C_k=0$ and the information bit is not inverted.

Type 2 Error ($H_0$ is accepted when it is false).

The information bit was received correctly, but the decoder inverts it. This occurs when the two errors affect different syndromes. Both syndromes have value=1, and this condition is indistinguishable from a single error on the information bit being checked. As a result, $C_k=1$ and the decoder inverts the received information bit.

The error processes leading to Type 1 and Type 2 errors occur in other threshold decoding systems, with only slight differences based on the number of syndromes entering a decision, and the guaranteed error-correcting capability of the code.

DESCRIPTION OF THE INVENTION

Three methods are disclosed. Method 1 reduces the incidence of Type 1 errors. Methods 2 and 3 reduce the incidence of Type 2 errors. The three methods can be used independently or in various combinations.

The invention can be specifically applied, with desirable effect, to decoding the following codes:

(1) The generalized Rate=$(n-1)/n$, single-error-correcting code developed by Massey in U.S. Pat. No. 3,566,352.

(2) The Rate=$\frac{1}{2}$, double-error-correcting code developed by Massey.

(3) The Rate=$\frac{1}{2}$ triple-error-correcting code developed by En in U.S. Pat. No. 4,193,062.

(4) All of the above codes, modified according to Kohlenberg's scheme, disclosed in U.S. Pat. No. 3,477,132, to correct isolated bursts of errors as well as scattered random errors.

In addition, it is assumed that the invention may be applied to decoding all members of the general class of threshold decodable forward-error-correcting codes.

METHOD FOR REDUCING THE INCIDENCE OF TYPE 1 ERRORS

In most error patterns that would normally result in a Type 1 Error, two conditions exist simultaneously:

A. Of all syndromes that check the information digit $r_i^{(j)}$ being decoded, the number of syndromes with value=1 is greater than or equal to a threshold $T_2$ defined below, but less than the algebraic decision threshold $T_1$:

$$0 < T_2 \leq \sum_{k=1}^{n} S_k < T_1$$

Where the $\{S_k\}$ is the set of syndromes checking said information digit, and only the syndromes with value=1 contribute to the sum.

B. A reliability measurement $R_i^{(j)}$ made on said information digit indicates low reliability.

Condition A is just the condition for a Type 1 error in a state-of-the-art hard decision threshold decoder employing a single threshold $T_1$. Condition B recognizes that most errors are associated with characteristics and observable qualities in the received analog waveform. These qualities can be used to test the reliability of received channel digits.

The invention defines a threshold $T_2$, such that $$0 < T_2 < T_1$$

$T_1$ is the algebraic decision threshold (without resort to the methods disclosed herein). $T_2$ is another threshold, an integral part of this invention. If the decision statistic equals or exceeds $T_2$ but is less than $T_1$, and the reliability $R_i^{(j)}$ of the information digit being decoded is low, said digit is corrected. Let $Y_A$ be a logical variable with value=1 when $$T_2 \leq D_s = \sum_{k=1}^{n} S_k < T_1.$$

and value=0 otherwise. Let $Y_B$ be a logical variable with value=1 when $R_i^{(j)}$ is HIGH, and value=0 otherwise. The invention defines a new correction signal $C_y$ to be applied to $r_i^{(j)}$:

$$C_y = Y_A \overline{Y_B} \qquad \text{(Eq. 5)}$$

where implied multiplication is a logical AND, and the overbar indicates logical negation. When $C_y=1$, correction of $r_i^{(j)}$ is ENABLED despite the failure of $D_s$ to meet or exceed $T_1$.

Optimum selection of $T_2$, and the reliability test yielding $R_i^{(j)}$, depends on the code being employed and the expected channel conditions. For example, a typical reliability test for a channel characterized by additive white Gaussian noise (AWGN) would be so-called alpha-flunk or null-zone test. In such a test, a channel digit with anomolously small signal amplitude would be assigned a low reliability. Alternatively, a typical reliability test in a jamming environment would test for an anomolously large signal amplitude. Such a condition would indicate the probable action of a jammer, and therefore imply low reliability.

A single reliability test may be applied uniformly to all received digits. Alternatively, reliability tests may be designed separately for each stream of channel digits entering the decoder (e.g., in the $R=\frac{2}{3}$ code illustrated in this disclosure, $\{\rho_i\}$, $\{r_i^{(1)}\}$ and $\{r_i^{(2)}\}$ represent the three streams of channel digits into the decoder).

When $T_2$ is large, a syndrome pattern $\{S_k\}_{xi(j)}$ with $$D_s = \sum_{k=1}^{n} S_k \geq T_2$$

will point toward $r_i^{(j)}$ without significant ambiguity. When $T_2$ is small—in particular when $T_2=1$ as in the generalized rate$=(n-1)/n$ code developed by Massey—it frequently will be equalled or exceeded due to random errors even when $r_i^{(j)}$ was received correctly. This would lead to false alarms, and induced Type 2 errors due to operation with the lower threshold. Decoders employing a small $T_2$ must therefore include a guard means to disable attempted correction based solely on $T_2$ and $R_i^{(j)}$. This guard means may employ a combination of methods, including examination of parity digit reliability $R_i^p$ and correlated correction decisions based on $T_1$. Specific methods depend on the code being implemented, but the general concepts are:

(1) Discount, wholly or partially, syndromes based on parity digits with low measured reliability.

(2) Since a correction based on decision threshold $T_1$ is inherently more reliable than a correction based on $T_2$, the decoder should first attempt to assign syndromes to decision sets $\{S_k\}$ such that $D_s \geq T_1$. Corrective action based on threshold $T_2$ should only be attempted with syndromes excluded from such decision sets.

Such a guard means is described and illustrated below in the particular case of Massey's rate$=\frac{2}{3}$, single-error-correcting code.

In all embodiments of the invention, correction signals $C_y$ are fed back into the syndrome register (in addition to enabling correction of information digits). This feedback removes the effects of detected errors from future correction decisions.

METHODS FOR REDUCING THE INCIDENCE OF TYPE 2 ERRORS

In most error patterns that would normally result in a Type 2 error, three conditions exist simultaneously:

A.

$$D_s = \sum_{k=1}^{n} S_k \geq T_1$$

B. $R_i^{(j)}$ is high

C. Some syndromes that are not members of the decision set $\{S_k\}$, but that contain error components in common with the members of $\{S_k\}$, have value$=1$.

Condition A enables corrective action by a state-of-the-art hard decision threshold decoder employing a threshold $T_1$. In most cases, this will be the appropriate response to an information digit that was received incorrectly. But it is also the condition for a Type 2 error when said information digit was received correctly. Condition B recognizes the fact that most digits received correctly will have a high mesasured reliability, whereas most digits received incorrectly will have a low measured reliability. Condition C recognizes the fact that, when a Type 2 error exists, the underlying channel errors will usually be associated with their own patterns of syndromes. This becomes more likely as the code rate increases, thereby increasing the proportion of information digits to parity digits.

The invenion, in using method 2, tests for the existence of conditions B and C, in addition to the threshold test defined by prior art (condition A). Let $Z_A$ be a logical variable with value$=1$ when condition A is satisfied, and value$=0$ otherwise. Similarly, let $Z_B$ and $Z_C$ be logical variables defined on conditions B and C respectively. The invention combines these logical variables to yield a correction signal $C_i'$:

$$C_i' = Z_A(\overline{Z}_C + \overline{Z}_B Z_C) \quad \text{(Eq. 6)}$$

where implied multiplication is a logical AND, addition is a logical OR, and the overbar indicates logical negation. Thus, an isolated channel error will yield $\overline{Z}_C=1$ and the correction signal follows $Z_A$ as in prior art. When the information digit subject to correction by $C_i'$ is correct, but $Z_A=1$ due to the influence of other channel errors, $Z_B=Z_C=1$ with high probability. Thus, the influence of $\overline{Z}_B$ will DISABLE $Z_A$ in most cases that would normally result in a Type 2 decoder error. In other words, when $Z_C=1$, (implying an ambiguous syndrome pattern) $Z_A$ is only ENABLED when $Z_B=0$ (implying low reliability on the information digit subject to correction). An example of this method for reducing the incidence of Type 2 errors is given below, for the Massey rate$=\frac{2}{3}$ single-error-correction code.

With some codes, particularly codes where the number of syndrome digits in the decision set $D_s$ is larger than $T_1$, a third method may be employed in lieu of method 2, to reduce the incidence of Type 2 errors. In this third disclosed method, a new decision threshold $T_3$ is defined such that $T_1 < T_3 \leq n$.

With this method, reliability of the information digit is used in the correction decision when $T_1 \leq D_s < T_3$.

In this range, the information digit checked by $\{S_k\}$ will be corrected by the decoder if it has low reliability, but will be passed out of the decoder as initially received if it has high reliability.

When $T_3 \leq D_s$, the improved decoder emulates prior art and the information digit checked by $\{S_k\}$ is corrected regardless of its measured reliability.

Defining $Z_A$ and $Z_B$ as above, $$C_i' = \begin{cases} Z_A \overline{Z}_B; & T_2 D_s < T_3 \\ Z_A & ; T_3 D_s \end{cases}$$

In all embodiments of the invention, correction signals $C_i'$ generated by method 2 or 3 are fed back into the syndrome register (in addition to ENABLING correction of $r_i^{(j)}$. This feedback removes the effects of detected errors from future correction decisions.

Figure 3:
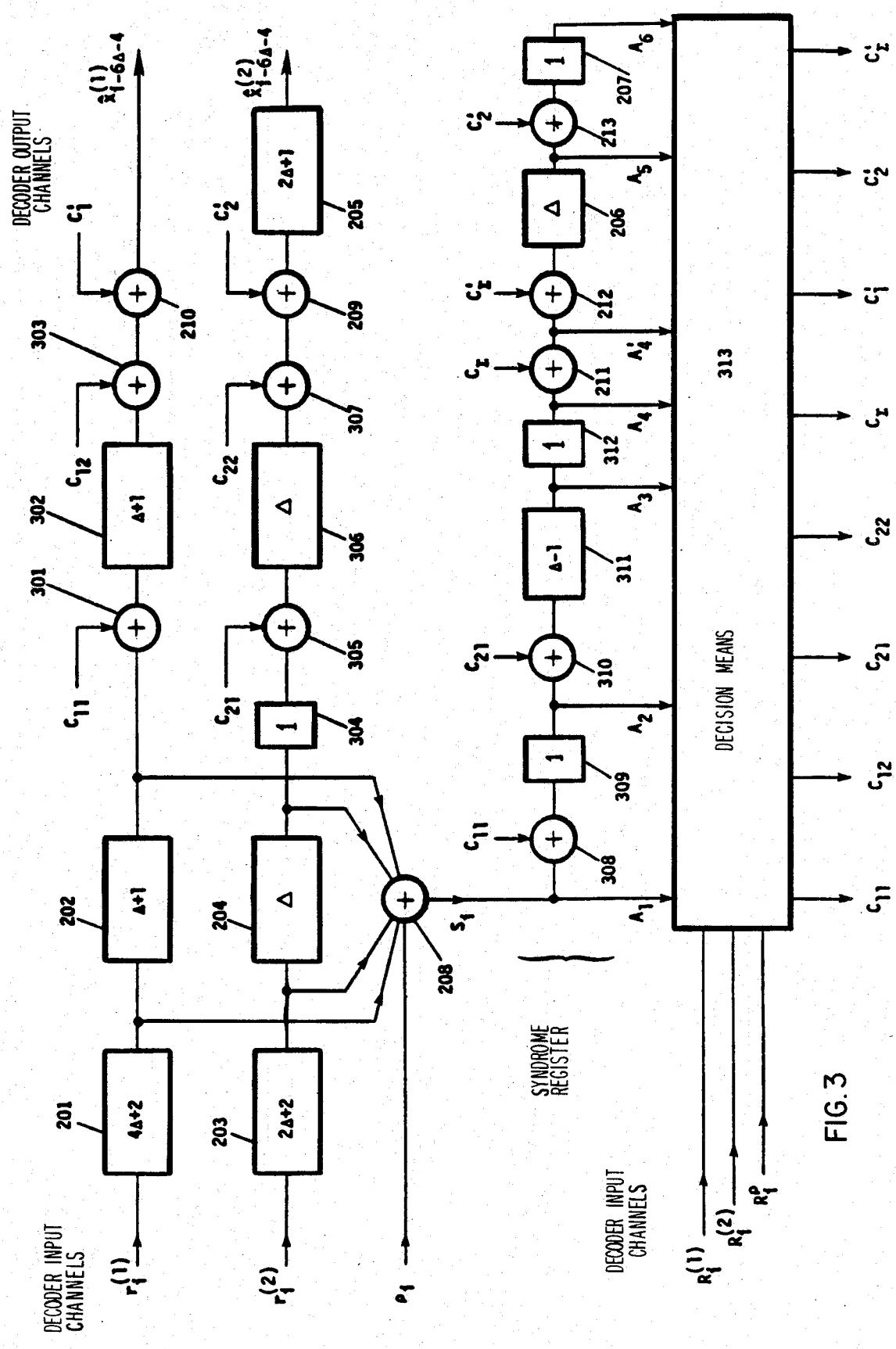
FIG. 3 is a block diagram for a decoder incorporating this invention that decodes the code produced by the encoder of FIG. 1.

SPECIFIC IMPLEMENTATON OF THE INVENTION AS IT RELATES TO THE RATE$=\frac{2}{3}$ SINGLE-ERROR-CORRECTING AND BURST-ERROR-CORRECTING THRESHOLD DECODABLE CODE OF MASSEY AND KOHLENBERG FIG. 3 illustrates a decoder for binary data incorporating the disclosed invention. The decoder is designed for the Rate$=\frac{2}{3}$ Massey coding system, as adapted after Kohlenberg to correct bursts of errors as well as single errors. Not shown, but implicitly present, are: (1) a receiver capable of generating an estimate of the transmitted channel bit, plus a one-bit measure of reliability; and (2) a device for presenting said receiver output to the decoder along the input lines shown.

Following the notation defined previously, $r_i^{(1)}$, $r_i^{(2)}$ and $p_i$ are the estimates of transmitted information and parity bits generated by the receiver. $R_i^{(1)}$, $R_i^{(2)}$ and $R_i^p$ are the one-bit reliability measures relating to $r_i^{(1)}$, $r_i^{(2)}$, and $p_i$, respectively. The reliability test should be selected and designed to optimize the performance of the decoder.

As illustrated in FIG. 3, the improved decoder adopts certain elements of prior art. These are indicated by device numbers 201-213, as initially defined in FIG. 2. However, the correction signals applied to correction means 209, 210, 211, 212, 213 differ from the correction signals of prior art. The invention is implemented through the use of new circuit elements 301-313. New correction signals $C_{11}$, $C_{12}$, $C_{21}$, $C_{22}$, and $C_\Sigma$ are defined. In addition, the correction signals $C_1$, $C_2$ illustrated in FIG. 2 are replaced by correction signals $C_\Sigma'$, $C_1'$, $C_2'$.

Syndrome digits $S_i$ are generated according to prior art.

After participating in syndrome generation, information digits are passed to the new correction means consisting of delay means 302, 304, 306 and inversion means 301, 303, 305, 307. These elements are exercised to reduce the incidence of Type 1 decoder errors (relative to prior art).

At time $t_i$ when $r_i^{(1)}$, $r_i^{(2)}$, $p_i$ are presented to the syndrome generator, information bits $r_{i-5\Delta-3}^{(1)}$ and $r_{i-3\Delta-2}^{(2)}$ are passed to said correction means.

Said correction means corrects most channel errors that would have appeared as Type 1 decoder errors in prior art. Correction signals $C_{11}$, $C_{12}$, $C_{21}$, and $C_{22}$ indicate the probable presence of an incorrect $r_i^{(j)}$ where an additional error acts to degrade one of the two syndromes checking said $r_i^{(j)}$.

Said correction signals are generated in decision means 313, described below.

After exiting said correction means consisting of 301-307, information bits pass through a further correction stage where correction signals $C_1'$ and $C_2'$ are applied. Said correction signals indicate the presence of all single isolated errors (as in prior art). Furthermore, said correction signals are disabled in the presence of most channel errors that would have appeared as Type 2 decoder errors in prior art. Said correction signals are generated in decision means 313, described below.

After undergoing possible corrective action by signals $C_1'$, $C_2'$, the processed bit streams are realigned by delay element 205 and offered as estimates $\{\hat{x}_{i-6\Delta-4}^{(1)}, \hat{x}_{i-6\Delta-4}^{(2)}\}$ of the transmitted information $\{x_{i-6\Delta-4}^{(1)}, x_{i-6\Delta-4}^{(2)}\}$.

As illustrated in FIG. 3, the syndrome register is augmented relative to prior art by additional delay elements 309, 311, 312 and correction stages 308, 310. All correction stages act to remove the effects of previously detected errors from current and future decisions. The syndrome register is tapped along its length to generate signals $A_1$, $A_2$, $A_3$, $A_4$, $A_4'$, $A_5$, $A_6$. These signals are inputs to decision means 313.

The decision means 313 takes as input said syndrome signals $A_1$, $A_2$, $A_3$, $A_4$, $A_4'$, $A_5$, and $A_6$ and the reliability measurements $R_i^{(1)}$, $R_i^{(2)}$, $R_i^p$. Said decision means outputs correction signals $C_{11}$, $C_{12}$, $C_{21}$, $C_{22}$, $C_\Sigma$, $C_1'$, $C_2'$, $C_\Sigma 40$. Said correction signals are applied to the information streams and syndrome stream to correct probable errors and remove the effects of said errors from future decisions.

Figure 4:
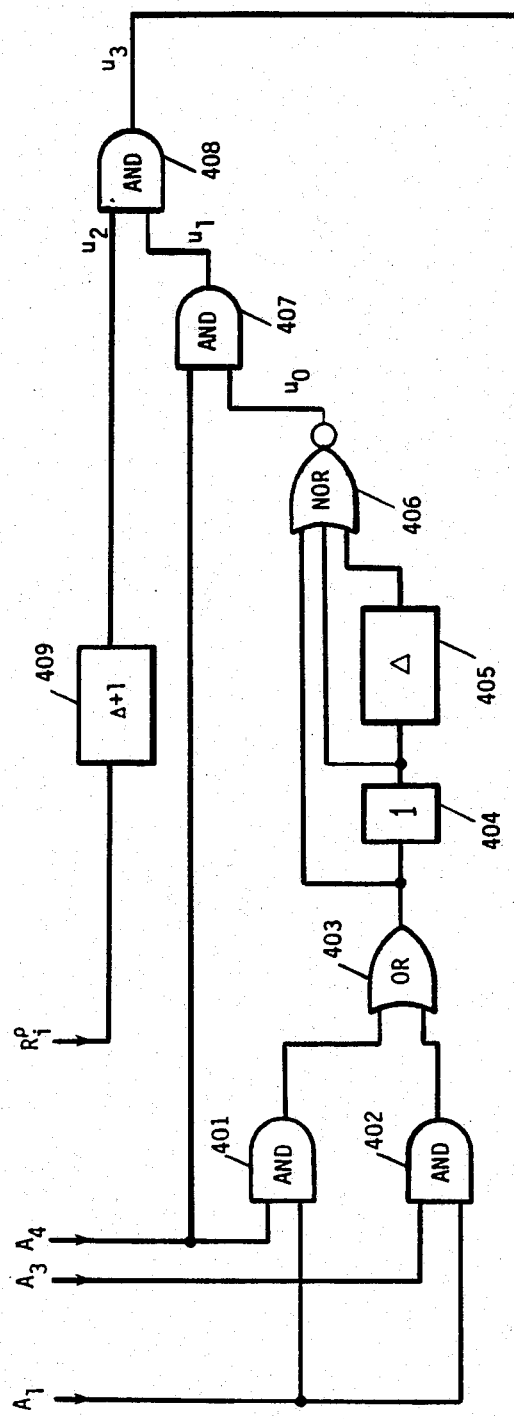
FIG. 4 is a detail of one part of the decision means disclosed in FIG. 3, illustrating a means for detecting most partially-masked channel errors, and generating correction signals to be applied thereto.
Figure 4:
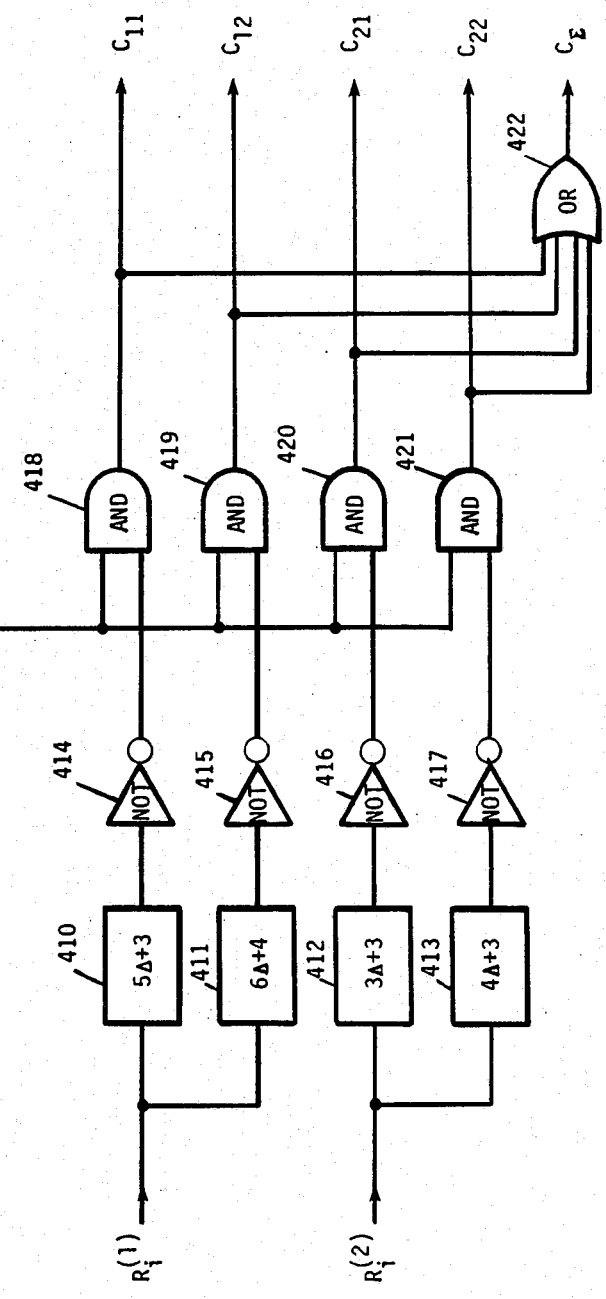
Figure 5:
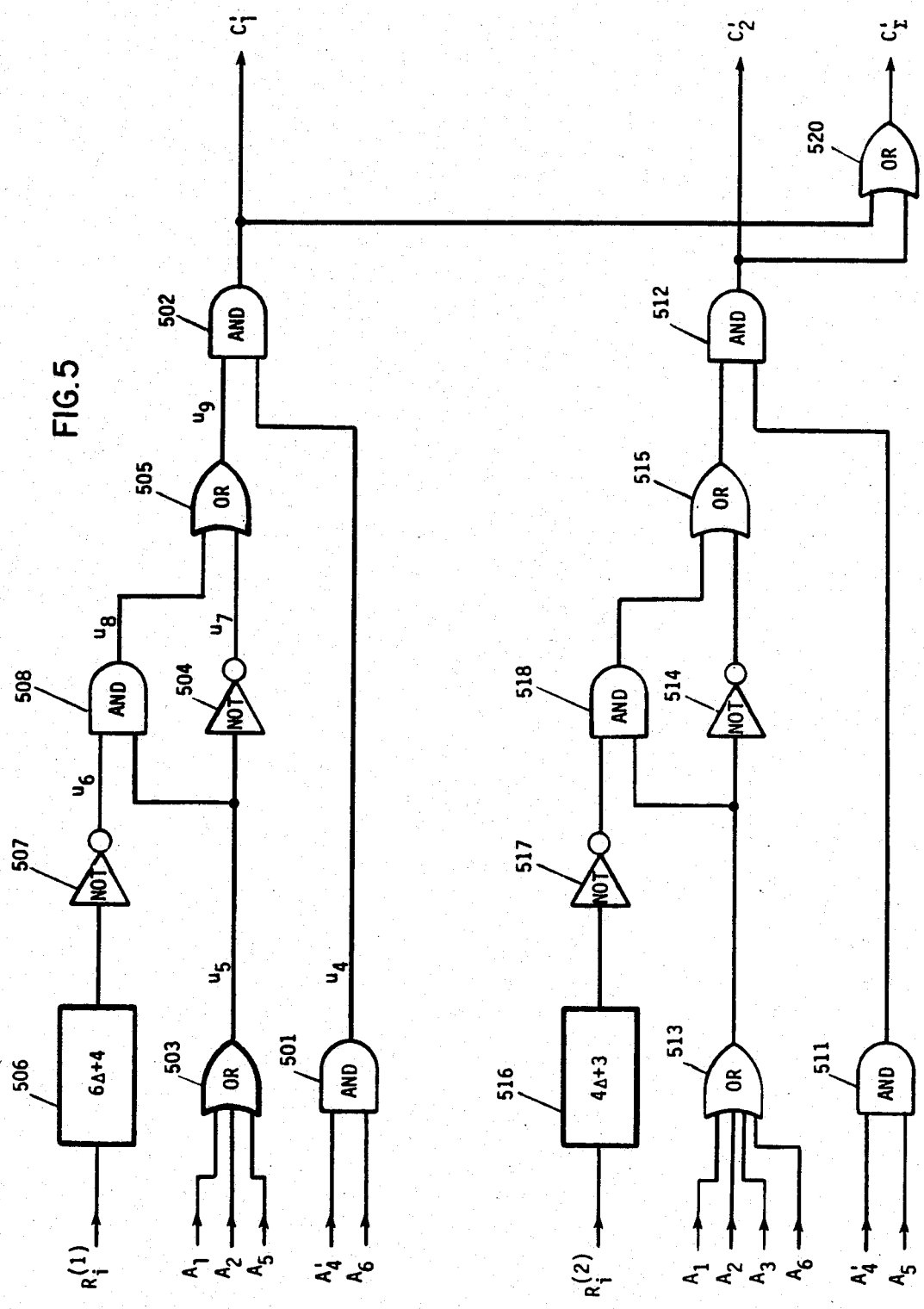
FIG. 5 is a detail of the second part of the decision means disclosed in FIG. 3, illustrating a means for detecting most channel errors correctable by the prior art decoder of FIG. 2, but further incorporating a guard means to disable corrective action in most cases where the prior art decoder of FIG. 2 would erroneously invert an information bit.

Decision means 313 is detailed in FIGS. 4 and 5. FIG. 4 illustrates an embodiment of the Type 1 error reduction means. FIG. 5 illustrates an embodiment of the Type 2 error reduction means, combined with a means to detect almost all channel errors correctable with the prior art decoder of FIG. 2.

The Type 1 error reduction means of FIG. 4 generates correction signals $C_{11}$, $C_{12}$, $C_{21}$, $C_{22}$, $C_\Sigma$. A correction signal has value=1, thereby inverting an information bit and one or two syndrome bits, when:

A. Said information bit had low measured reliability, and

B. Only one of the syndromes checking said information bit had value=1, and

C. The parity bit entering into the syndrome with value=1 had high reliability. Note that, since $T_2$ is small ($T_2=1$ for this decoder), a guard means is incorporated to avoid excessive occurrence of induced Type 2 errors. The guard means is incorporated in condition C.

Consider the stream of syndrome bits propogating through the syndrome register illustrated in FIG. 3. With the code illustrated here, error indications usually occur in pairs. These paired indicators are separated by $\Delta$ or $(\Delta+1)$ positions, and identify probable errors on particular information bits. When a syndrome is not paired in this manner, it is either due to: (1) a channel error on the parity bit affecting said syndrome; or (2) a combination of two channel errors that would result in a Type 1 decoder error with a prior art decoder of FIG. 2. These two cases are differentiated by the Type 1 error reduction means, which is implemented to correct received bits $r_i^{(j)}$ as they come under the influence of correction signals $C_{11}$, $C_{12}$, $C_{21}$, $C_{22}$. The four correction stages are illustrated in FIG. 3 as correction means 301, 303, 305, 307. Most errors on parity bits are ignored.

Information bit reliability is presented to the circuit by $R_i^{(1)}$ and $R_i^{(2)}$. These are combined with delay means 410, 411, 412, 413, and inversion means 414, 415, 416, 417 to present signals to AND gates 418, 419, 420, 421. A particular signal has value=1 if the information bit correctable by the AND gate had low measured reliability. The signal is zero otherwise. This supports implementation of condition A stated above.

Condition B is implemented by the unpaired syndrome detection means 401-407. When syndromes are paired to indicate an error on a particular information bit, they will appear simultaneously on input lines $A_1$ and $A_3$, or $A_1$ and $A_4$. This will cause a HIGH input to OR gate 403. Operation of 403, in combination with delay means 404, 405, and NOR gate 406, causes $u_0=0$ when each of said syndromes appear at $A_4$. Likewise, the operation of AND gate 407 causes the output of the unpaired syndrome detection means $u_1=0$. This drives $u_3$ LOW, thereby disabling correction signals $C_{11}$, $C_{12}$, $C_{21}$, and $C_{22}$. In these cases, involving paired syndromes, corrective action is implemented by decision means illustrated in FIG. 5, and described below. Alternatively, in most cases involving an unpaired syndrome, said syndrome will appear at $A_4$ while $u_0=1$. This causes $u_1=1$, thereby supporting condition B above.

Condition C is implemented by reliability input $R_i^p$, in combination with delay means 409. $U_2=1$ when the parity bit affecting the syndrome bit appearing at $A_4$ has high reliability. $U_2=0$ otherwise.

When conditions A, B, and C are satisfied for a particular received information bit, the correction signal affecting said bit will be HIGH. This signal is modulo-2 added to said bit in the new correction means illustrated in FIG. 3. It is further employed to invert the syndrome giving rise to corrective action. It is even further used to invert the syndrome with value=0, which checks the said information bit. With the embodiment of FIG. 4, this last inversion is carried out when said syndrome with value=0 is trailing the syndrome that triggered corrective action. With addition delay elements and slight redesign, however, inversion could be applied regardless of relative syndrome positions.

Correction signals $C_{11}$, $C_{12}$, $C_{21}$, $C_{22}$ are calculated simultaneously. This is required by the common use of certain input signals. As a consequence of simultaneous decision-making, $C_\Sigma$ is generated and applied to 211 (in FIG. 3). The syndrome at this position enters all decisions leading to correction signals $C_{11}$, $C_{12}$, $C_{21}$, $C_{22}$. The syndrome feedback correction means 211 (of prior art) is in the correct position to apply $C_\Sigma$. Its function is therefore redefined by the disclosed invention. Rather than apply a feedback correction signal $C_1$, it is used to apply a common feedback correction signal $C_\Sigma$ due to the new Type 1 Error Reduction Means. (The function of $C_1$ is supported by $C_\Sigma'$ described below).

The error detector means of FIG. 5 supports two goals:

A. It detects almost all channel errors that would have been detected by the prior art decoder of FIG. 2; and B. It further detects almost all syndrome patterns that would result in a Type 2 decoder error, if said syndrome pattern were to be applied to the prior art decoder of FIG. 2.

While a small fraction of algebraically-correctible errors remain uncorrected with the means of FIG. 5, this shortfall is compensated and overshadowed by the large number of potential Type 2 decoder errors that are avoided.

The error detector for channel 1 will be described. Operation of the detector for channel 2 may be understood by analogy.

The goal of this error detector (for channel 1) is to set correction signals $C_1'$ and $C_\Sigma'$ HIGH ($=1$) when $A_4'=A_6'=1$—but to avoid this setting action when the information bit subject to correction is actually correct.

The single error detector means 501, representing prior art, identifies (1) all channel error events correctible by prior art, and (2) all syndrome patterns that would result in a Type 2 decoder error using prior art. It is the purpose of the remaining circuit elements to separate these two conditions, and only ENABLE the correction signals under condition 1. Circuit elements 502–508 (and 520) represent new elements of the invention disclosed herein.

In a potential Type 2 decoder error event, (condition (2) above), an underlying channel error acting on an information bit will cause two syndromes with value=1. One of said syndromes is an element of $\{A_4', A_6\}$, thereby contributing to the potential Type 2 error event. The other said syndrome is an element of $\{A_1, A_2, A_5\}$. This latter set includes all syndromes that cross-check the error components found at $\{A_4', A_6\}$. If any of $\{A_1, A_2, A_5\}$ have value=1, it is an indication of a potential Type 2 error event. This test is implemented by OR gate 503 which outputs signal $u_5$.

When all of $\{A_1, A_2, A_5\}$ have value=0, the improved decoder declares low probability of a Type 2 error, and the algebraic correction signal $u_4$ (of prior art) is ENABLED. This is achieved through the logic chain 504, 505 which sets $u_9$ HIGH thereby ENABLING $u_4$.

$u_4$ is similarly ENABLED if $u_5=1$, but the reliability of the information bit subject to correction is LOW. In this case, $u_7=0$ but $u_6=u_8=u_9=1$ thereby ENABLING $u_4$.

When $u_5=1$ and the information bit reliability is HIGH, $u_6=u_8=u_9=0$ thereby DISABLING $u_4$. In this case, the probability that the information bit is correct outweighs the probability that it is incorrect.

The correction signals generated by this error detector are applied to the information and syndrome streams as illustrated in FIG. 3.

In the prior art decoder of FIG. 2, correction signal $C_1$ is implicitly calculated prior to $C_2$. In the disclosed invention, $C_1'$ and $C_2'$ are calculated simultaneously. Since a subset of the decision inputs are common to $C_1'$ and $C_2'$, this yields improved performance. A consequence of simultaneous decision-making is the generation of $C_\Sigma'$. This is applied at syndrome feedback correction means 212, implementing the joint functions of correction means 211, 212 illustrated in FIG. 2.

I claim:

1. In a digital communication channel apparatus for decoding of threshold decodable forward-error-correcting codes, the improvement comprising, in combination, a syndrome generator for receiving digital signals on said digital communications channel and generating a plurality of syndrome signals indicative of reception errors, a syndrome register for storing a predetermined sequence of said syndrome signals and delivering selected signals of said syndrome sequence in parallel to output terminals of said syndrome register, a reliability measurement device for measuring the reliability with which digital signals are received, said reliability measuring device having a plurality of output terminals, and delivering to said output terminals a separate reliability measurement for each received digital signal, decision means coupled to receive in parallel the syndrome signals at said output terminals of said syndrome register, and coupled to receive the reliability measurements at said output terminals of said reliability measurement device, said decision means including a first plurality of logic elements, coupled to process selected ones of said syndrome signals appearing at the output terminals of said syndrome register, and selected ones of said reliability measurements appearing at the output terminals of said reliability measurement device, concurrently or in the past, and interconnected to:

(1) identify "strong isolated syndromes", where a strong isolated syndrome is defined to be a syndrome signal which indicates the presence of an error, and which was generated in part by a received parity symbol associated with a reliability measurement indicating high reliability, and which cannot be associated with a sufficiently large set of other syndromes to enable correction via exceedence of an optimum algebraic decision threshold, where the term "optimum algebraic decision threshold" is understood to imply the decision threshold leading to minimum decoded probability of error when reliability measurements are unavailable;

(2) identify "weak information symbols" where a weak information symbol is defined as an information symbol associated with a reliability measurement indicating low reliability;

(3) identify weak information symbols that were used in the generation of each strong isolated syndrome;

(4) generate a correction signal for each weak information symbol used in the generation of a strong isolated syndrome;

(5) deliver said correction signals to the output terminals of said plurality of logic elements;

said decision means including a second plurality of logic elements, coupled to process selected ones of said syndrome signals appearing at the output terminals of said syndrome register, and selected ones of said reliability measurements appearing at the output terminals of said reliability measurement device, concurrently or in the past, and interconnected to:

(1) identify a set of syndromes containing all syndromes orthogonal on an individual information symbol, in which sufficiently many syndromes individually indicate the presence of an error to justify correction of the said individual information symbol with an optimum algebraic decision threshold;

(2) generate a correction signal except when the following two conditions are true:

(a) a syndrome not contained in the correction set is found, which is orthogonal to at least one syndrome in the correction set over some information symbol, and which indicates the presence of an error; and (b) the measured reliability of the information symbol checked by the correction set indicates a high probabilitly that the symbol was correctly received, (3) deliver said correction signals to the output terminals of said second plurality of logic elements, to correct errors and reduce the incidence of false corrections; and correction means coupled to receive the correction signals from the said first and said second pluralities of logic elements, and apply said correction signals to the digital signals received from said communication channel to remove the effects of detected errors.

2. The invention defined in claim 1 including correction means coupled to receive the correction signals from the said first and said second pluralities of logic elements, and apply said correction signals to the syndromes contained in the said syndrome register, to remove the effects of detected errors from future correction decisions; said correction means performing its function via separate additions of a correction signal with the syndromes orthogonal on the information symbol to which the correction signal applies, said replacement of the syndromes with the results of said separate additions.

3. A decoder for decoding a threshold-decodable forward-error-correcting code with optimum algebraic decision threshold $T_1$, incorporating a means for detecting and correcting most partially-masked channel errors where the algebraic decision statistic $D_s$ is bounded by $0 < D_s T_1$, wherein the improvement comprises, reliability measurement means, means coupled to said reliability measurement means for using reliability measurements $R_i(j)$ made on received information digits $r_i(j)$ by said reliability measurement means, threshold means connected to said reliability measurement means for establishing a second decision threshold $t_2 \leq T_1$, means for detecting when said reliability measurement $R_i(j)$ is LOW, and digital circuit means to correct $r_i(j)$ when $D_s$ calculated on received information digit $r_i(j)$ is bounded by $T_2 \leq D_2 < T_1$, and when the reliability measurement $R_i(j)$ on $r_i(j)$ is LOW, where:

$r_i(j)$ is the received digit corresponding to any selected transmitted information digit and possibly received in error, $R_i(j)$ is a binary measurement of the reliability with which r was received, where a value of 1 or HIGH indicates a high probability that $r_i(j)$ was received correctly, and a value of 9 or LOW indicates lower probability of correct reception, $D_s$ is the algebraic decision statistic calculated on the received information digit $r_i(j)$, relating to the transmitted information digit, calculated by finding the algebraic sum of syndromes which check the transmitted information digit, and therefore contain $x_i(j)$ in the respective subsets of information and parity digits upon which the respective syndromes were calculated, where $D_s$ is calculated separately for each information digit to be decoded, wherein:

a syndrome indicates the probable presence or absence of channel errors in one or more received information and parity digits contained in a subset of the received information and parity digits, calculated by taking the modular sum of the elements of said subset, where the received parity digits in said subset were calculated at the transmitter based on the information digits in said subset, and the syndrome can alternatively be expressed as a modular sum of error components relating to the information digits and parity digits contained in said subset, $T_1$ is an algebraic decision threshold known in the prior art, to which the decision statistic $D_s$ is compared, and which, when equalled or exceeded by $D_s$, causes the decoder to declare an error on the received information digit relating to $D_s$, and $T_2$ is a second decision threshold, disclosed herein, which is applied to the decision statistic $D_s$ as described above, as part of the processng leading to improved decoding performance.

4. The decoder of claim 3, further including a guard means to disable correction based solely on the joint occurrence of $T_2 \leq D_s < T_1$ and $R_i(j) = LOW$.

5. The decoder of claim 4, wherein said guard means includes: (1) measurements of $R_i^p$ made on the reliability of received parity digits; (2) a means to associate each reliability measurement individually with the syndrome digit generated in part by consideration of the parity digit measured; and (3) a means to disable correction when (a) $T_2 \leq D_s < T_1$, (b) $R_i(j) = LOW$, and (c) some or all of the parity digits, affecting the syndromes contributing to the exceeded threshold $D_s \geq T_2$, have LOW reliability where:

$R_i^p$ is a binary measurement of the reliability with which a parity digit was received, where a value of 1 or HIGH indicates a high probability that the digit was received correctly, and a value of 0 or LOW indicates lower probability of correct reception, and where the superscript indicates that the measurement relates to a received parity digit, and the subscript indicates a means of indexing capable of selecting the reliability measurement made on a unique parity digit.

6. A decoder for decoding a threshold-decodable forward-error-correcting code with optimum algebraic decision threshold $T_1$, incorporating means for disabling modification of a received information digit, when said digit was received correctly but channel errors cause the algebraic decision statistic $D_s$ to equal or exceed $T_1$, wherein the improvement comprises first means connected to receive said reliability measurements $R_i^{(j)}$ made on the received information digits, and second means for causing an examination of selected syndromes in addition to those syndromes entering the algebraic decision statistic $D_s$.

7. The decoder of claim 6 including disabling means for disabling modification of a received information digit when the condition $D_s \geq T_1$ is accompanied by: (a) high measured reliability on information digit being decoded; and (b) at least one of the additional selected syndromes examined by the decoder indicate the presence of an error.

8. The decoder of claim 7 including means for examining syndromes that check received digits contained in the syndromes set $\{S_k\}$, excluding the information digit being decoded where:

$\{S_k\}$ is the syndrome decision set containing those syndromes, and only those syndromes, which check the particular information digit being decoded, the syndromes contained in $\{S_k\}$ may each check one or more information digits in addition to the information digit currently being decoded, and these are the received digits referred to above.

9. The decoder of claim 7 wherein the additional syndromes examined are those syndromes that check the received digits contained in the decision set $\{S_k\}$, excluding those information digits being decoded at the current and previous steps.

10. In a digital communication channel apparatus for decoding of threshold decodable forward-error-correcting codes, the improvement comprising, in combination, a syndrome generator for receiving digital signals on said digital communications channel and generating a plurality of syndrome signals indicative of reception errors, a syndrome register for storing a predetermined sequence of said syndrome signals and delivering selected signals of said syndrome sequence in parallel to output terminals of said syndrome register, a reliability measurement device for measuring the reliability with which digital signals are received, said reliability measuring device having a plurality of output terminals, and delivering to said output terminals a separate reliability measurement for each received digital signal, decision means coupled to receive in parallel the syndrome signals at said output terminals of said syndrome register, and coupled to receive the reliability measurements at said output terminals of said reliability measurement device, said decision means including:

a first plurality of logic elements, coupled to process selected ones of said syndrome signals appearing at the output terminals of said syndrome register, and selected ones of said reliability measurements appearing at the output terminals of said reliability measurement device, a second plurality of logic elements, coupled to process selected ones of said syndrome signals appearing at the output terminals of said syndrome register, and selected ones of said reliability measurements appearing at the output terminals of said reliability measurement device, and correction means coupled to receive the correction signals from the said first and said second pluralities of logic elements, and apply said correction signals to the digital signals received from said communication channel to remove the effects of detected errors.

11. The invention defined in claim 10, said correction means including means for applying said correction signals to the syndromes contained in the said syndrome register, to remove the effects of detected errors from future correction decisions; said correction means performing its function via separate additions of a correction signal with the syndromes orthogonal on the information symbol to which the correction signal applies, and replacement of the syndromes with the results of said separate additions.

12. In a method for decoding a threshold-decodable forward-error-correctng code with an optimum algebraic decision threshold $T_1$, including determining the algebraic decision statistic $D_s$ is equal to or greater than said optimum algebraic decision threshold $T_1$ for disabling the modification of a received information digit when said digit was received correctly but channel errors cause said algebraic decision statistic $D_s$ to equal or exceed $T_1$, the improvement comprising applying said reliability measurements to the received information digits, and determining an additional decision threshold $T_3 > T_1$ where: $T_3$ is a third decision threshold, and then applying said decision statistic $D_s$ as part of the processing leading to improved decoding performance.

* * * * *